March 12, 1963 J. A. PECAR 3,081,408

COUNTER WITH MEANS FOR SATURATING A TRANSISTOR IN A STAGE TO CHANGE THE CONDUCTIVITY OF THE STAGE

Filed Nov. 1, 1961

INVENTOR

Joseph A. Pecar,

BY

ATTORNEY

United States Patent Office 3,081,408
Patented Mar. 12, 1963

3,081,408

COUNTER WITH MEANS FOR SATURATING A TRANSISTOR IN A STAGE TO CHANGE THE CONDUCTIVITY OF THE STAGE

Joseph Albert Pecar, 9511 Tuckerman Road, Seabrook, Md.

Filed Nov. 1, 1961, Ser. No. 149,836
7 Claims. (Cl. 307—88.5)
(Granted under Title 35, U.S. Code (1952), sec. 266)

Figures 1, 2:
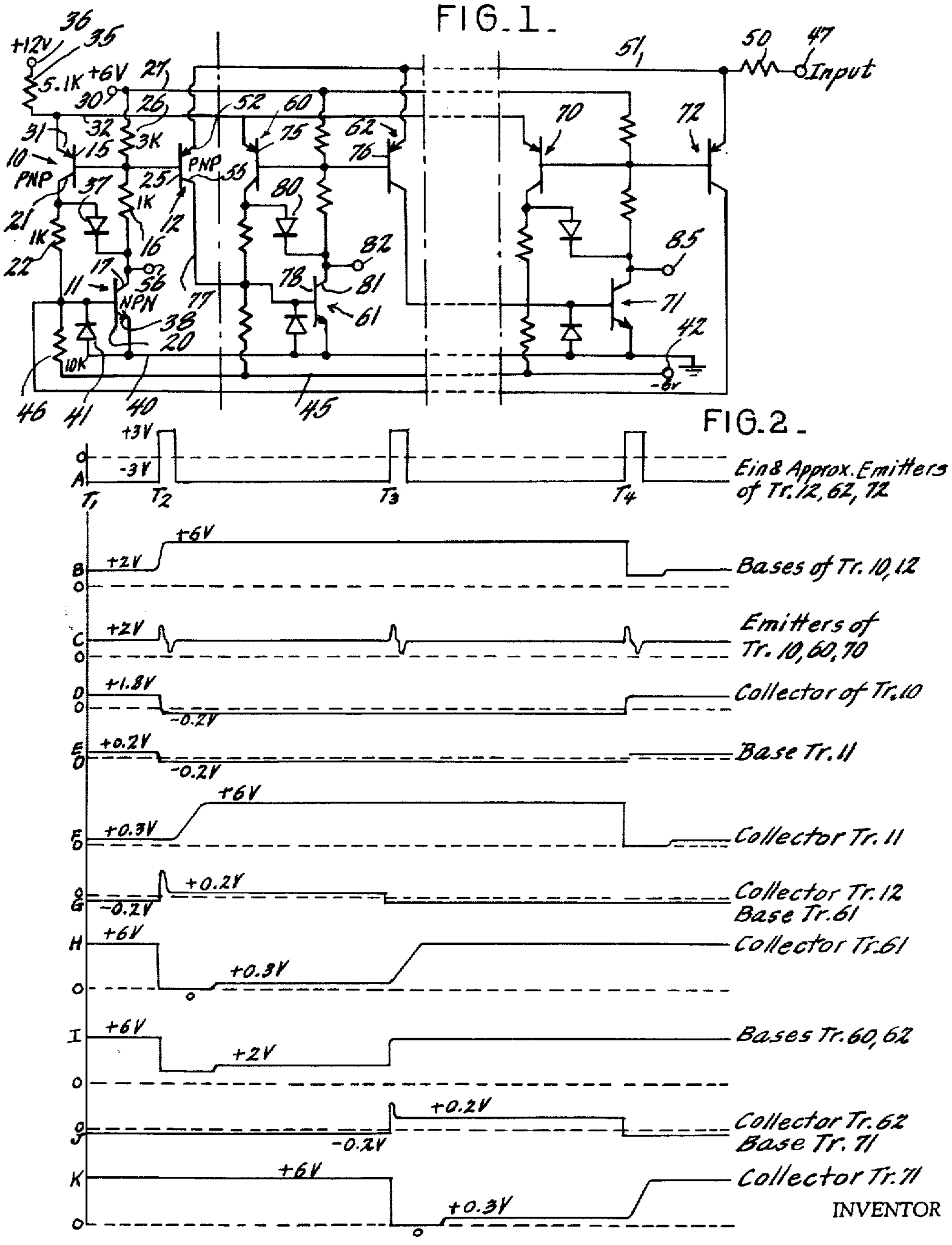

The invention described herein may be manufactured and used by or for the Government for governmental purposes without the payment to me of any royalty thereon.

This invention relates to transistorized counters, and more particularly to transistorized counters having extremely high frequency response.

Advancements in transistor technology have resulted in a greatly increased use of semiconductor products in electronic circuits. Transistor circuits possess some features which are advantageous when compared to conventional electronic tube circuits. In general, transistor circuits are most advantageous when they can be assembled completely from semiconductor devices. Hybrid circuits, or those that employ both electronic tubes and transistors, have disadvantages such as the necessity of including two separate power supplies, since transistors and tubes normally operate with considerably different supply potentials. As a result of such difference in operating principles, buffer stages are generally required when both types of components are employed in the same circuitry. Therefore, in most cases, completely transistorized circuits are preferable to hybrid circuits.

While many counter circuits devised heretofore have included purely electronic tubes or hybrid circuits, several have been devised which are completely transistorized. An example of the latter type circuit is Patent No. 2,876,365 to Slusser, granted March 3, 1959. In this counter circuit, as in other previous transistorized counter circuits, capacitive coupling is used between the various stages in the counter, and similar coupling schemes are used in electronic tubes and hybrid circuits. Such capacitive coupling might be adequate for relatively slow speed applications, but they are not usable for high-speed work such as that required for computers. In this high-speed work, frequencies between several megacycles and 10 or 11 megacycles is common in the present state of the art, and such frequency requirements are increasing rapidly. None of the counter circuits devised heretofore, including transistorized counter circuits, is capable of being used at these high frequencies.

It is a primary object of this invention to provide a new and improved transistorized counter.

It is another object of this invention to provide new and improved transistorized counters having extremely high frequency response.

With these and other objects in view, a transistorized counter embodying the invention may include a plurality of stages each of which includes a transistor, means for interconnecting the stages and for effectively maintaining only one stage in the counter conductive at any given time, triggering means connected to all of the stages and means included in the interconnecting means and energized by the triggering means for saturating the transistor in a stage other than the conducting stage in order to render such other stage conductive.

More specifically, in one embodiment of the present invention, a transistorized counter is provided having a plurality of stages wherein each stage includes three transistors. Two of the transistors are of opposite symmetry types, and their interconnections include components which permit both transistors to conduct simultaneously, in order for the stage to be "on," and to be cut off simultaneously for the "off" condition. An antisaturation diode is also provided, and this diode prevents both of the opposite-type transistors from saturating. By using such a diode, inexpensive transistors may be used to provide a counter operable at relatively high frequencies since the transistors do not have to undergo the time-consuming process of being removed from saturation. Each stage also includes a third transistor which performs the function of a coupling means between the stage in which it is located and a succeeding stage.

Upon application of an input pulse, only the transistors in the conducting one of the various stages will be immediately affected thereby. Shortly thereafter, one of the opposite-type transistors in the stage succeeding the conducting stage is forced into saturation, the above-mentioned antisaturation diode being bypassed at this time. When the input pulse ceases, only the succeeding stage will be rendered conductive since only a transistor therein was saturated. Because of this saturation and the delay caused thereby, only the succeeding stage can be rendered conductive. With this structure, an extremely high frequency counter is provided with inexpensive transistors. In another embodiment of the present invention, still faster counters can be provided by using higher quality transistors and deleting the antisaturation diode from the circuit. As in the first embodiment described, the key feature for rendering successive stages conductive involves forcing one of the transistors of opposite symmetry into saturation so that the delay caused by its coming out of saturation renders it conductive.

Other objects and advantages of the present invention will be apparent from the following detailed description, when considered in conjunction with the accompanying drawing, wherein:

FIG. 1 is a transistorized counter showing one embodiment of the present invention, and FIG. 2 includes a series of timing diagrams showing potential conditions existing on several of the various components of the counter circuit shown in FIG. 1 upon the application of several input pulses thereto.

In the embodiment of the invention shown in FIG. 1, a transistorized ring counter is shown. The counter may have any number of stages, as illustrated by the dashed-line connections between the second and third stages, and three stages are illustrated, with the last stage being connected to the first to complete the ring. Before the operation of the circuit shown in FIG. 1 as a ring counter is described, the operation of an individual stage thereof will be described. Therefore, for illustrative purposes, the first stage, including transistors 10, 11 and 12 will be described.

As shown in FIG. 1, the transistor 10 is a PNP type such as a 2N414, and the transistor 11 is of opposite symmetry, that is, an NPN type such as a 2N438. A base 15 of the PNP transistor 10 is connected by a resistor 16 to a collector 17 of the NPN transistor 11. Similarly, a base 20 of the NPN transistor 11 is connected to a collector 21 of the PNP transistor 10 by a resistor 22. A base 25 of the PNP transistor 12 is connected to the base 15 of the PNP transistor 10 and, through a resistor 26, to a conductor 27 which has a positive potential (e.g., +6 volts) applied thereto at a terminal 30. Completing the circuit connections of the transistors 10 and 11, an emitter 31 of the PNP transistor 10 is connected to a conductor 32 which in turn is connected through a resistor 35 to a second, higher potential (e.g., +12 volts) source which is applied to a terminal 36. Also, an antisaturation diode 37 is connected between the collector 21 of the transistor 10 and the collector 17 of the transistor 11.

An emitter 38 of the NPN transistor 11 is connected to a conductor 40 which in turn is connected to a source of reference potential such as ground. Also, a diode 41 is connected between the base 20 of the transistor 11 and ground to speed switching by keeping the base 20 of the transistor 11 at a slight negative potential, near ground potential, at times that would tend to go more negative. A source of negative potential (e.g., −6 volts) is applied to a terminal 42 which is connected over a conductor 45 and through a resistor 46 to the base 20 of the NPN transistor 11 to provide operating potential for this transistor. With respect to one third transistor 12 in the first stage of the ring counter shown in FIG. 1 (a PNP type such as a 2N414), input pulses to the counter are applied to an input terminal 47, through a resistor 50 and over a conductor 51 to an emitter 52 of the transistor 12. Finally, an output to a succeeding stage in the counter may be taken from the first stage at a collector 55 of the transistor 12, and an output from the first stage for utility purposes may be taken from the collector 17 of the NPN transistor 11 at a terminal 56.

The operation of the first stage of the counter shown in FIG. 1 will be described in three parts which correspond to the following conditions: (1) the nonconducting or cut-off condition, (2) the transient condition, and (3) the fully conducting or "on" condition.

Consider, first, the nonconducting condition of the first stage shown in FIG. 1 (that is, when the potential of the emitter 31 of the transistor 10 is less than +6 volts) and when no input pulse is being applied to the terminal 47. With neither of the transistors 10 and 11 conducting, it can be seen that no current can flow anywhere in the first stage. The −6 volts and +6 volts supplies, besides being collector supplies, perform the dual function of holding the transistors 10 and 11 in the cut-off condition. This reverse-biasing technique is employed to provide temperature stability to the stage. With this technique, the reverse terminal current, usually designated $I_{co}$, which flows in the base circuit of a transistor (such as from the base 20 of the transistor 11 and through the resistor 46) always tends to turn on a transistor. The actual amount of current which flows at a given time is directly proportional to the ambient temperature. Hence, if the cut-off condition is to be assured at elevated temperatures, a reverse-biasing technique must be used.

It will be noted that when the transistors 10 and 11 of the first stage are cut off, the base 15 of the PNP transistor 10 and the collector 17 of the NPN transistor 11 are at a +6 volt potential with respect to ground. Similarly, as will be described more fully herein below, the base 20 of the NPN transistor 11 and the collector 21 of the PNP transistor 10 are at a small, negative potential (such as −.2 volt), with the diode 41 preventing this potential from going any more negative. Under these conditions, the antisaturation diode 37 connecting the collectors 17 and 21 is reversed biased and, for the purpose of analysis, can be considered as removed from the circuit.

Considering, now, the first stage of the counter shown in FIG. 1 as it passes from the nonconducting condition to the conducting condition, assume that conduction of the transistor 10 is brought about in any manner, that is, assume that this transistor is forward biased by any means to start current flowing in the collector 21 thereof. Even though current starts flowing in the collector 21 of the PNP transistor 10, the NPN transistor 11 will not begin conduction until it is of sufficient magnitude to balance the current flowing through the resistor 46, this current being the reverse-biased current on the NPN transistor 11. When this magnitude of current is attained, the NPN transistor 11 begins conduction, and current flows in both the base 20 and the collector 17 thereof.

The current in the collector 17 of the NPN transistor 11 reduces the potetnial of the base 15 of the PNP transistor 10, thereby causing this latter transistor to conduct an increased amount of current. Under the conditions outlined, the collector current of each of the transistors in the stage effectively becomes the base current of the other. This results in an enormous loop gain and allows the transition from the nonconducting condition of the stage to the fully conducting condition to occur in an extremely small interval of time. It will be seen, then, that the use of opposite-symmetry transistors results in much more rapid switching operations than is possible with vacuum tubes since it is impossible to arrange two vacuum tubes with positive feedback so that each drives the other into conduction simultaneously.

Considering further the fully conducting condition of the first stage of the counter shown in FIG. 1, if the collector-to-collector diode 37 were removed from the circuit, the transistors 10 and 11 would drive each other into saturation once conduction was started. The circuit would operate without the diode 37 in that it would still be bistable. However, the rate at which the stage could be switched from the conducting to the nonconducting condition would be slow when moderately priced transistors are used. As will be explained more fully herein below, transistors of higher quality are presently available which could be used effectively in the counter circuit shown in FIG. 1 without the antisaturation diode 37 and still permit extremely fast switching. However, the diode 37 is shown in FIG. 1 since it is extremely useful when the less expensive transistors are used since, when saturated, such transistors exhibit what may be termed storage-time effects.

As explained above, the diode 37 acts as an antisaturation device in that it prevents simultaneously both transistors from saturating. To explain this more fully, consider the first stage of the counter shown in FIG. 1 as the PNP transistor 10 starts conducting. When this occurs, collector current starts to flow, and there will be a potential drop across the resistor 22. When both transistors 10 and 11 are fully conducting, this potential drop across the resistor 22 causes the diode 37 to be forward biased so that it presents a low impedance between the collectors 21 and 17. If the forward voltage drop across the diode 37 is small in comparison with the drop across the resistor 22, then the base-to-collector junction of the NPN transistor 11 must be reversed biased, thereby preventing saturation. A similar analysis can be made regarding the PNP transistor 10, showing that it, too, is prevented from saturating as the stage is rendered conductive. Therefore, as a result of the inclusion of the antisaturation diode 37, the turn-off time of the transistors 10 and 11, even when inexpensive transistors exhibiting long storage-time effects are used, can be greatly reduced. This effectively increases the frequency response of the stages, making them suitable choices for use in high-speed counters, even when inexpensive transistors are used.

The operation of the complete counter shown in FIG. 1 will now be described. As explained hereinabove, each stage of the counter includes a pair of bistable elements such as the PNP transistor 10 and the NPN transistor 11, and an additional transistor such as the PNP transistor 12. In FIG. 1, similar transistors in the second and third stages are designated, respectively, 60, 61, 62 and 70, 71, 72. As will be described, it is the function of the PNP transistor 12, and all similar transistors, to transfer the conducting stage from one position to the next-succeeding position. However, as will be seen, in the absence of what may be termed a transfer pulse at the terminal 47, the transistor 12 and all similar transistors (transistors 62 and 72) are completely ineffective. For example, referring to the first stage of the counter shown in FIG. 1, the base 25 of the transistor 12 may be at either a +2 volt potential or a +6 volt potential, depending on whether the stage is conducting or nonconducting, respectively. In the absence of a transfer pulse, such as that shown in FIG. 2A (which extends between the values of −3 and +3 volts), the emitter 52 of the PNP transistor 12 is at some negative potential which closely approximates the −3 volts of the input waveform shown in FIG. 2A. The potential of the collector 55 of the transistor 12 may be, as can be seen in FIG. 2G, either −.2 volt, if the second stage of FIG. 1 is nonconducting, or +.2 volt if the second stage is conducting. Therefore, in the absence of a transfer pulse, both the base-to-emitter and the base-to-collector junctions of the transfer transistor 12 are reversed biased. Hence, the operation of the bistable elements, the PNP transistor 10 and the NPN transistor 11, is not affected by the addition of the third transistor 12, except upon the transition of a stage from a conducting condition to a nonconducting condition.

To describe the circuit shown in FIG. 1 while in a quiescent operating condition, consider the counter shown therein during the absence of any transfer pulses as those shown in FIG. 2A. As the supply potentials are switched on, one of the stages therein will begin conduction while the others will remain cut off. That this is so depends, of course, upon the values of the various components. For example, with the potential values shown in FIG. 1 and with the resistor 35 having a value of 5.1K ohms, as shown in FIG. 1, at least one stage must become conductive when power is applied to the circuit. Assuming that the first stage has become conductive, the potential of both the base 15 and emitter 31 of the transistor 10 is approximately +2 volts as shown in FIGS. 2B and 2C, respectively. It can be shown that +2 volts is the minimum emitter potential which will keep a bistable stage such as the first stage of FIG. 1 in conduction. Under this minimum voltage condition, the stage draws approximately 2 milliamperes. Since it is impossible, under any circumstances, for current through the 5.1K ohm resistor 35 to be greater than 2.35 milliamperes (12 volts/5.1K ohms), it is obvious that only one stage can be conducting at any given time. If no special circuit is provided for causing a predetermined one of the stages to be rendered conductive when power is applied thereto, the stage which becomes conductive at that time is strictly a random process, depending upon the individual characteristics of the transistors in the stages. It is common to provide special circuitry to assure that a given stage conducts when power is applied thereto, but such special circuitry is not shown in FIG. 1. The important point is that, with the counter shown in FIG. 1, only one stage can be conductive at any given time, since this is one of the main prerequisites for any counter circuit.

Assume, now, that the first stage of the counter shown in FIG. 1 is conducting at a time shortly prior to the application of an input pulse at the terminal 47. That is, referring to FIG. 2A, consider the circuit of FIG. 1 between the times T1 and T2. During this increment of time, the potential on the bases 15 and 25 of the PNP transistors 10 and 12 in the first stage will be approximately +2 volts as shown in FIG. 2B. As shown in FIG. 2I, the potential on bases 75 and 76 of PNP transistors 60 and 62 in the second, nonconducting stage is +6 volts. The same is true of the PNP transistors 70 and 72 in the third stage. With these values of potentials, it can be seen that an input pulse at the terminal 47 having an amplitude of +3 volts will cause current to flow only in the transfer transistor 12 of the first stage. The amount of current flowing in the transistor 12 of the first stage, when an input pulse is applied thereto, is essentially limited only by the internal impedance of the pulse generator and of the current limiting resistor 50.

The collector 55 of the transfer transistor 12 is connected directly by a conductor 77 to a base 78 of the NPN transistor 61 in the second stage, which is similar to the NPN transistor 11 of the first stage. It will be noted that an antisaturation diode 80 in the second stage is bypassed by this connection and is effectively removed from the circuit. As a result of this configuration, practically all of the current flowing in the emitter 52 of the transfer transistor 12 is available as base current for the NPN transistor 61 of the second stage. It is possible, therefore, by proper selection of the current-limiting resistor 50, to drive the NPN transistor 61 of the second stage into saturation with the application of an input pulse to the terminal 47. This statement is true only if the PNP-NPN transistor combination of the first stage is conducting prior to the application of the input pulse, as was assumed hereinabove.

As can be seen by referring to FIGS. 2F and 2H, the application of an input pulse to the terminal 47 instantaneously causes the second stage to be rendered conductive. The waveform shown in FIG. 2F is that of the potential of the collector 17 of the NPN transistor 11 which is the point from which an output pulse may be taken from the first stage at the output terminal 56. Likewise, an output may be taken from a collector 81 of the NPN transistor 61 in the second stage at an output terminal 82, and such an output is shown in FIG. 2H. From these figures, it can be seen that the occurrence of an input pulse (FIG. 2A) at time T2 renders the NPN transistor 61 in the second stage conductive immediately, drawing an increased amount of current over the conductor 32 and through the resistor 35. This added amount of current which flows through the resistor 35 reduces the voltage which is being applied to the emitters of all of the bistable stages (such as the emitter 31 of the transistor 10 of the first stage) to a value below that minimum value which is required for conduction of any of the stages. As a result of this action, all of the stages of the counter attempt to become nonconductive. The stage whose NPN transistor was driven into saturation (the NPN transistor 61 of the second stage) cannot become nonconducting as fast as the remaining stages. Therefore, the second stage, and only the second stage, remains conductive when the input pulse which occurs at time T2 dissipates. It can be seen, then, that each input pulse of FIG. 2A renders a succeeding stage conductive which in turn causes the preceding stage, which had been conductive, to be rendered nonconductive. Thus, the successive rendering conductive of the stages of the counter shown in FIG. 1 is accomplished by taking advantage of the storage time of a transistor (such as the NPN transistor 61 of the second stage), a characteristic normally thought of as a disadvantage. As a matter of fact, it was because of this disadvantage that the antisaturation diodes, such as the diodes 37 and 80, are provided, when relatively inexpensive transistors are used. As was stated above, these antisaturation diodes are effective in permitting a stage to be rendered nonconductive rapidly. However, as described above, when a succeeding stage is being rendered conductive, the antisaturation diodes are effectively removed from the circuit. This was seen with respect to the antisaturation diode 80 which was effectively bypassed when the transfer transistor 12 was rendered conductive and by the conductor 77 which is connected to the base 78 of the NPN transistor 61. It can be seen, then, that the storage-time effects of the lower NPN transistors are utilized to render the associated counter stage conductive, but are held to a minimum by the associated antisaturation diode when a stage is being rendered nonconductive since such storage-time effects are harmful at this time.

With this structure, inexpensive transistors can be used, and an optimum frequency response can be achieved. This is so since the transfer transistors, such as the transistor 12, are utilized in lieu of the normal coupling capacitor which would limit the frequency response of a counter much more than that of a transistor. Also, the transfer transistor causes the lower NPN transistor of the succeeding stage to be saturated, and this normally harmful effect is actually utilized to cause the succeeding stage to be rendered conductive. Finally, when inexpensive transistors are used, the antisaturation diodes cause an increase of the frequency response of the counter by preventing the saturation of the PNP-NPN transistor combination during conduction of the stage and after the input pulse which caused it to conduct has ceased. The results of this action can be seen by referring to FIGS. 2H and 2K which represent output pulses from the counter which appear at the output terminal 82 in the second stage and an output terminal 85 in the third stage. For example, at time T2, the waveform shown in FIG. 2H drops from +6 volts to zero, where it stays for a short time before rising to +3 volts. This drop to zero potential is due to the saturation of the NPN transistor 61 in the second stage since that stage is being rendered conductive under the influence of the input pulse. It can be seen that a short time after the associated input pulse of FIG. 2A ceases, the potential on the collector 81 of the NPN transistor 61 (FIG. 2H) rises slightly since the transistor pulls out of saturation because of the effect of the antisaturation diode 80 in the second stage. It might also be pointed out with respect to the output waveforms shown in FIGS. 2F, 2H and 2K, that designs can be achieved so that each stage is capable of delivering 6 to 10 milliampers of output current under 65° C. ambient temperature conditions, even when germanium transistors are used.

Many modifications of the present invention may be made without departing from the spirit and scope thereof. For example, the counter of the present invention may easily be adapted to reversible operation. Also, as suggested above, when high-quality transistors exhibiting extremely short storage-time effects are used, the PNP transistor of each bistable stage (the transistors 10, 60 and 70) may be allowed to remain in saturation. Hence, the resistor connected to its base (such as the resistor 16) may be eliminated. The NPN transistor of each bistable stage (the transistors 11, 61 and 71) are then still kept out of saturation, in the absence of a transfer pulse being applied to the terminal 47, by the combined action of the resistor connected to its base (such as the resistor 22) and the saturated collector-to-base junction of the associated PNP transistor. The resulting configuration uses two less components per stage and provides higher-speed operation of the counter. For example, by using the better quality transistor, operation has been achieved at rates up to 12 megacycles, and it is feasible that this rate could be extended to 100 megacycles since no capacitors are necessary anywhere in the circuit.

What is claimed is:

1. A transistorized counter which comprises a plurality of stages each of which includes a transistor, means for interconnecting the stages and for effectively maintaining only one stage in the counter conductive at any given time, triggering means connected to the stages, and means included in the interconnecting means and energized by the triggering means for saturating the transistor in a stage other than the conducting stage in order to render such other stage conductive.

2. A transistorized counter which comprises a plurality of stages, each of the stages having at least one transistor therein, means for interconnecting the stages and for effectively maintaining only one stage in the counter conductive at any given time, a source of pulses connected to the stages, and means included in the interconnecting means and energized by a pulse from the pulse source for saturating the transistor in a stage other than the conductive stage in order to render such other stage conductive.

3. A transistorized counter which comprises a plurality of stages capable of being rendered either nonconductive or conductive, each of the stages having at least one transistor therein, means for connecting the stages together in a series and for effectively maintaining only one stage in the series conductive at any given time, a source of triggering pulses connected to each of the stages, and means included in the connecting means and energized by a triggering pulse for saturating the transistor in one of the nonducting stages in order to render such stage conductive.

4. A transistorized counter which comprises a plurality of stages which are capable of being placed into two different states of conduction, each of the stages having at least one transistor therein, means for so interconnecting the stages that only one of the stages can exist in a first of the two conductive states at any given time, triggering means connected to all of the stages, and means included in the interconnecting means and energized by the triggering means for saturating the transistor in one of the stages in the second of the conductive states in order to place such stage in the first conductive state.

5. A transistorized counter which comprises a plurality of stages, each of the stages including a first transistor and a second transistor, means for connecting the second transistor of each stage to the first transistor of a succeeding stage, a source of transfer pulses applied to the second transistors of all stages, means interconnecting the stages such that the first transistor of only one stage is conducting at any given time during the absence of a transfer pulse, and means included in the last-mentioned means and energized by a transfer pulse for causing the second transistor associated with a conducting stage to render conductive the first transistor in the succeeding stage and to saturate it, thereby causing only the first transistor in the succeeding stage to be conductive upon dissipation of the transfer pulse.

6. A transistorized counter which comprises a plurality of stages, each of the stages including a first transistor in a bistable portion of the stage and a second transistor in a conduction-transfer portion of the stage, a source of supply potential, means interconnecting the stages and connecting them to the supply potential such that the first transistor of only one stage is effectively conducting at any given time, a source of transfer pulses applied to all transfer transistors, means included in the interconnecting means for rendering effective only the second transistor in the conductive stage upon the application thereto of a transfer pulse, and means connecting the second transistor in the conductive stage to the first transistor in a nonconducting stage for rendering conductive and saturating the latter transistor, the rendering conductive of the first transistor in the nonconducting stage causing the supply potential to drop to a value such that the bistable portions of all stages attempt to become nonconductive and the saturating of such transistor maintaining only it conductive upon the dissipation of the transfer pulse.

7. A transistorized ring counter which comprises a plurality of stages, each of the stages including at least one transistor in a bistable portion of the stage that is capable of being rendered conductive and nonconductive and including a conduction-transfer transistor, each of the transistors having input and output electrodes, a source of transfer pulses connected to the input electrodes of all transfer transistors, a source of supply potential, means interconnecting the stages in a ring and connected them to the source of supply potential such that the transistor in the bistable portion of only one of the stages is conducting during the absence of a transfer pulse and such that the application of a transfer pulse to all transfer transistors can render conductive only the transfer transistor associated with a conducting stage, and means connecting the output electrode of each of the conduction-transfer transistors to the input electrode of the transistor in the bistable portion of the succeeding stage so that the rendering conductive of the conduction-transfer transistor in a conducting stage by a transfer pulse causes the transistor in the bistable portion of the succeeding stage to be rendered conductive and saturated, whereby the conduction of the transistor in the bistable portion of the succeeding stage causes the supply potential to drop so that all stages attempt to become non-conductive and whereby the saturation of such transistor maintains it conductive upon the dissipation of the transfer pulse.

References Cited in the file of this patent

UNITED STATES PATENTS

| | | |
|---|---|---|
| 2,882,423 | MacSorely | Apr. 14, 1959 |
| 2,977,539 | Townsend | Mar. 28, 1961 |

UNITED STATES PATENT OFFICE

CERTIFICATE OF CORRECTION

Patent No. 3,081,408 March 12, 1963

Joseph Albert Pecar

It is hereby certified that error appears in the above numbered patent requiring correction and that the said Letters Patent should read as corrected below.

Column 3, line 17, after "that" insert -- it --; line 22, for "one" read -- the --; column 8, line 15, for "nonducting" read -- nonconducting --; line 72, for "connected" read -- connecting --.

Signed and sealed this 24th day of September 1963.

(SEAL)
Attest:

ERNEST W. SWIDER
Attesting Officer

DAVID L. LADD
Commissioner of Patents